United States Patent
Shih et al.

(10) Patent No.: US 8,652,868 B2
(45) Date of Patent: Feb. 18, 2014

(54) IMPLANTING METHOD FOR FORMING PHOTODIODE

(75) Inventors: Yu-Shen Shih, Hemei Township (TW);
Ching-Hwanq Su, Tainan (TW);
Wei-Ming You, Taipei (TW);
Chih-Cherng Jeng, Madou Township (TW); Kuo-Cheng Lee, Tainan (TW);
Yen-Hsung Ho, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/410,165

(22) Filed: Mar. 1, 2012

(65) Prior Publication Data

US 2013/0230941 A1    Sep. 5, 2013

(51) Int. Cl.
*H01L 21/00*    (2006.01)

(52) U.S. Cl.
USPC .......... 438/70; 250/214.1; 257/292; 257/432; 257/460; 438/73

(58) Field of Classification Search
USPC ............ 257/292, 432, 460; 438/73, 70
See application file for complete search history.

(56) References Cited

U.S. PATENT DOCUMENTS

| | | | | |
|---|---|---|---|---|
| 5,136,171 A * | 8/1992 | Leung et al. | ............... | 250/492.2 |
| 6,262,447 B1 * | 7/2001 | Chi | ............... | 257/296 |
| 7,265,397 B1 * | 9/2007 | Tower et al. | ............... | 257/223 |
| 7,388,187 B1 * | 6/2008 | Liu et al. | ............... | 250/214.1 |
| 7,838,325 B2 * | 11/2010 | Hsu et al. | ............... | 438/68 |
| 7,901,974 B2 * | 3/2011 | Venezia et al. | ............... | 438/73 |
| 2003/0094583 A1 * | 5/2003 | Jang et al. | ............... | 250/492.21 |
| 2003/0183850 A1 * | 10/2003 | Pain et al. | ............... | 257/200 |
| 2007/0108371 A1 * | 5/2007 | Stevens et al. | ............... | 250/214.1 |
| 2009/0001494 A1 * | 1/2009 | Park et al. | ............... | 257/432 |
| 2009/0200587 A1 * | 8/2009 | Venezia et al. | ............... | 257/292 |
| 2010/0140675 A1 * | 6/2010 | Rhodes | ............... | 257/292 |
| 2010/0270636 A1 * | 10/2010 | Huang et al. | ............... | 257/432 |
| 2011/0032405 A1 * | 2/2011 | Nozaki et al. | ............... | 348/308 |
| 2011/0085067 A1 * | 4/2011 | Venezia et al. | ............... | 348/308 |
| 2011/0260280 A1 * | 10/2011 | Chuang et al. | ............... | 257/460 |
| 2011/0266645 A1 * | 11/2011 | Chao | ............... | 257/432 |
| 2012/0149145 A1 * | 6/2012 | Yang et al. | ............... | 438/87 |

OTHER PUBLICATIONS

Titus, Image sensors that capture your attention, 2001, Sensors Magazine, p. 1-6.*
Reproduced Fig. 2b and Fig. 4c of Stevens.*

* cited by examiner

*Primary Examiner* — Zandra Smith
*Assistant Examiner* — Sophia Nguyen
(74) *Attorney, Agent, or Firm* — Slater & Matsil, L.L.P.

(57) ABSTRACT

An implanting method for forming a photodiode comprises providing a substrate with a first conductivity, growing an epitaxial layer on the substrate, implanting ions with a second conductivity in the epitaxial layer from a front side of the substrate and implanting ions with the first conductivity in the epitaxial layer from the front side of the substrate to form a photo active region adjacent to the front side and a photo inactive region underneath the photo active region. By employing the implanting method, an average doping density of the photo active region is approximately ten times more than an average doping density of the photo inactive region.

20 Claims, 8 Drawing Sheets

IMPLANTING METHOD FOR FORMING PHOTODIODE

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption and higher noise immunity. In addition, CMOS image sensors may be fabricated on the same high volume wafer processing lines as logic and memory devices. As a result, a CMOS image chip may comprise both image sensors and all the necessary logics such as amplifiers, A/D converters and the like.

CMOS image sensors are pixelated metal oxide semiconductors. A CMOS image sensor typically comprises an array of light sensitive picture elements (pixels), each of which may include transistors (switching transistor and reset transistor), capacitors, and a photo-sensitive element (e.g., a photo-diode). A CMOS image sensor utilizes light-sensitive CMOS circuitry to convert photons into electrons. The light-sensitive CMOS circuitry typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers such as dielectric layers and interconnect metal layers formed on top of the substrate, wherein the interconnect layers are used to couple the photodiode with peripheral circuitry. The side having additional layers of the CMOS image sensor is commonly referred to as a front side, while the side having the substrate is referred to as a backside. Depending on the light path difference, CMOS image sensors can be further divided into two major categories, namely front-side illuminated (FSI) image sensors and back-side illuminated (BSI) image sensors.

In a FSI image sensor, light from the subject scene is incident on the front side of the CMOS image sensor, passes through dielectric layers and interconnect layers, and finally falls on the photodiode. The additional layers (e.g., opaque and reflective metal layers) in the light path may limit the amount of light absorbed by the photodiode so as to reduce quantum efficiency. In contrast, there is no obstruction from additional layers (e.g., metal layers) in a BSI image sensor. Light is incident on the backside of the CMOS image sensor. As a result, light can strike the photodiode through a direct path. Such a direct path helps to increase the number of photons converted into electrons.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, backside illuminated image sensors. The embodiments of the disclosure may also be applied, however, to a variety of image sensors. Hereinafter, various embodiments will be explained in detail with reference to the accompanying drawings.

Figure 1:
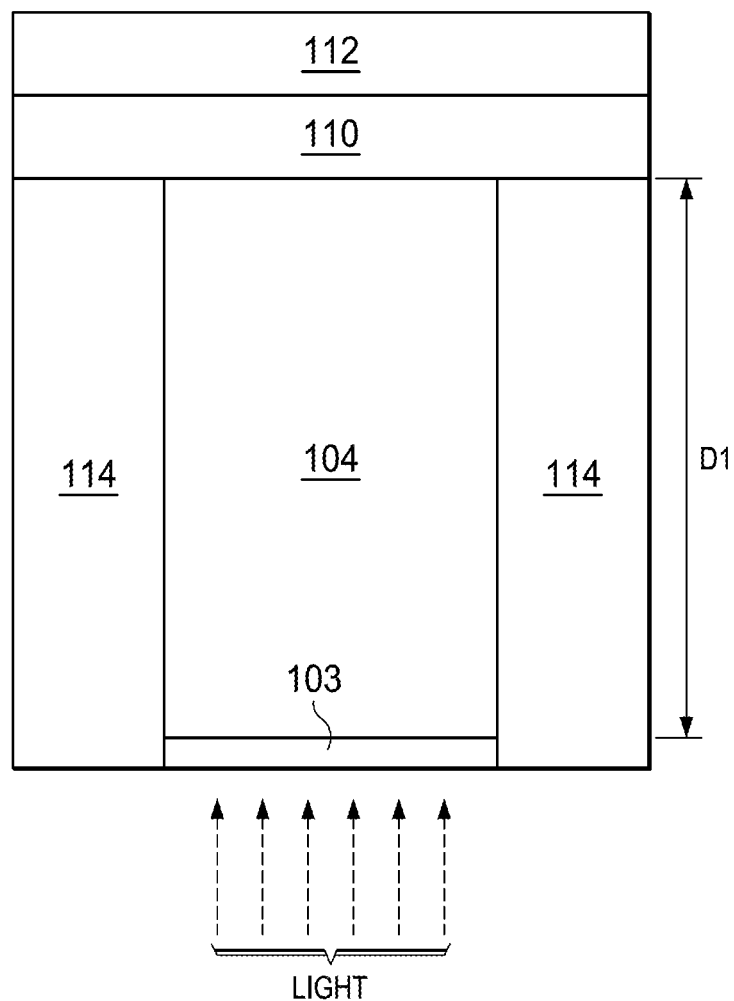
FIG. 1 illustrates a simplified cross sectional view of a backside illuminated image sensor in accordance with an embodiment.

FIG. 1 illustrates a simplified cross sectional view of a backside illuminated image sensor in accordance with an embodiment. The backside illuminated image sensor 100 is formed in an epitaxial layer over a silicon substrate. According to the fabrication process of backside illuminated image sensors, the silicon substrate has been removed in a backside thinning process. As shown in FIG. 1, a portion of epitaxial layer 103 remains. A photo active region 104 is formed in the remaining epitaxial layer 103.

The photo active regions (e.g., photo active region 104) may comprise, for example, photo-diodes formed by implanting impurity ions into the epitaxial layer 103. Furthermore, the photo active regions may be a PN junction photo-diode, a PNP photo-transistor, an NPN photo-transistor or the like. In accordance with an embodiment, the photo active regions such as photo active region 104 may comprise a p-type layer formed on an n-type region, wherein the n-type region is formed on an epitaxial layer 103 grown from a p-type semiconductor substrate (not shown).

The backside illuminated image sensor 100 further comprises an isolation region 114 formed in the epitaxial layer 103. The isolation region 114 may be implemented by using field oxide regions or shallow trench isolation (STI) structures. As shown in FIG. 1, the isolation region 114 encloses the photo active region 104 so as to separate the photo active regions of the backside illuminated image sensor 100 from adjacent image sensors (not shown).

The backside illuminated image sensor 100 may comprise a plurality of additional layers such as dielectric layer 110 and interconnect metal layer 112 formed over the substrate. For simplicity, hereinafter the side having additional layers of the backside illuminated image sensor 100 is referred to as a front side, while the side having the substrate is referred to as a backside.

Throughout the description, the depth of a photo active region is defined as the distance between the front side of the substrate and the photo active region's edge opposite to the front side. For example, the depth of the photo active region 104 is defined as D1, which is in a range from about 2 um to about 2.5 um in accordance with an embodiment.

An advantageous feature of having a backside illuminated image sensor 100 is that there is no obstruction from additional layers (e.g., metal layers) in the backside illuminated image sensor 100. As shown in FIG. 1, light is incident on the backside of the backside illuminated image sensor 100. As a result, light can strike the photo active region 104 through a direct path. Such a direct path helps to increase the number of photons converted into electrons so that more photons can be converted into electrons without being absorbed by the substrate. The detailed fabrication process of forming the backside illuminated image sensor 100 will be described below with respect to FIG. 2-8.

Figure 2:
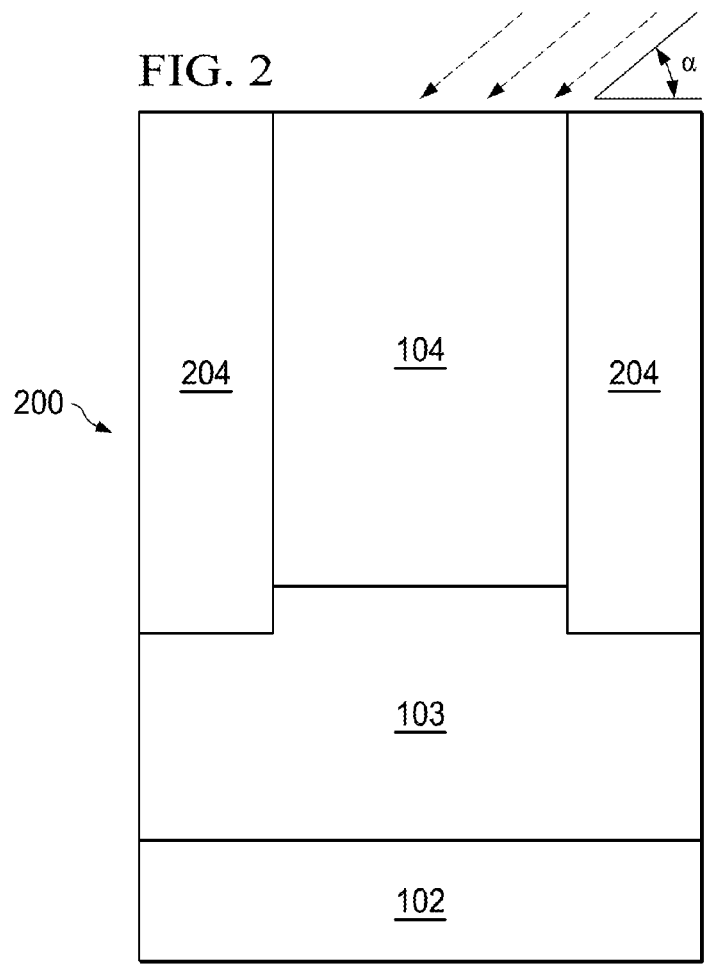
FIG. 2 is a cross sectional view of a backside illuminated image sensor wafer when a front side ion implantation process is performed on a substrate in accordance with an embodiment.

FIGS. 2-8 illustrates a method of fabricating a backside illuminated image sensor in according with an embodiment. FIG. 2 is a cross sectional view of a backside illuminated image sensor wafer when a front side ion implantation process is performed on a substrate in accordance with an embodiment. The backside illuminated image sensor wafer 200 comprises a substrate 102 having a first conductivity. In accordance with an embodiment, the substrate 102 is a p-type substrate. The substrate 102 may be formed of silicon, germanium, silicon germanium, graded silicon germanium, semiconductor-on-insulator, carbon, quartz, sapphire, glass, or the like, and may be multi-layered (e.g., strained layers). A p-type epitaxial layer 103 is grown on the p-type substrate 102.

In accordance with an embodiment, n-type impurity ions are implanted from the front side of the wafer into the p-type epitaxial layer 103 to form an n-type photodiode region (not shown). In addition, p-type impurity ions are implanted from the front side of the wafer into the n-type photodiode region to form a p-type diode region (not shown). As shown in FIG. 2, both the n-type implantation and the p-type implantation may have a tilt angle α. In accordance with an embodiment, the tilt angle α is in a range from about one degree to about seven degrees. In addition, both the n-type implantation and the p-type implantation may be implemented by using a high energy ion beam. In accordance with an embodiment, the high energy ion beam has an energy level in a range from about 300 keV to about 1400 keV.

The n-type photodiode region and the p-type photodiode region further form a photodiode region 104. As shown in FIG. 2, the photodiode region 104 is formed in the p-type epitaxial layer 103 over the p-type substrate 102.

The backside illuminated image sensor wafer 200 may comprise a plurality of pixels (not shown), each of which comprises a photodiode region (e.g., photodiode region 104). In order to prevent crosstalk between adjacent pixels, an isolation region 204 is employed to enclose the photodiode region 104. In accordance with an embodiment, the isolation region may be a shallow trench isolation (STI) structure. The STI structure may be formed by etching a portion of the substrate to form a trench and filling the trench with oxide and/or other dielectric materials. The isolation region 204 helps to prevent reflected light from adjacent pixels from reaching the photodiode region 104.

Figure 3:
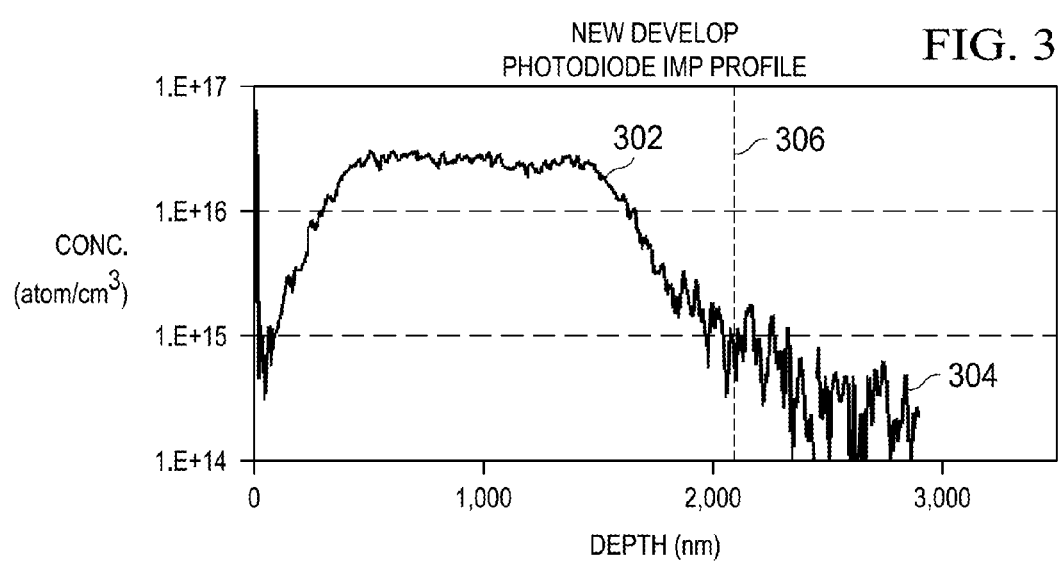
FIG. 3 illustrates a doping density curve of a backside illuminated image sensor in accordance with an embodiment.

FIG. 3 illustrates a doping density curve of a backside illuminated image sensor before a thinning process is applied to the backside illuminated image sensor in accordance with an embodiment. The horizontal axis of FIG. 3 represents the depth of a backside illuminated image sensor. The vertical axis of FIG. 3 represents the doping density of the backside illuminated image sensor, which includes a photo active region and a photo inactive region. More particularly, the photo active region represents the active region in which photons can be converted into electrons without being absorbed in the substrate. In accordance with an embodiment, the photo active region of the backside illuminated image sensor is of a depth in a range from about 2 um to about 2.5 um.

Referring back to FIG. 2, the portion of the epitaxial layer 103 below the photo active region 104 is referred to as the photo inactive region, which will be removed in a subsequent thinning process. As shown in FIG. 3, a dashed line 306 is used to label the border between the photo active region and the photo inactive region. In accordance with an embodiment, in a backside illuminated image sensor, the portion beyond a depth of 2.15 um (e.g., the right side of the dashed line 306) will be removed in a subsequent thinning process. The thinning process will be described below with respect to FIG. 6.

A first portion 302 and a second portion 304 of the doping density curve illustrate the doping density of a photo active region and a photo inactive region of a backside illuminated image sensor respectively. The curve shows that the doping density of the substrate drops in the region beyond a depth more than 2.15 um. In particular, in a photo active region, the doping density is uniform in the majority portion of the photodiode. In accordance with an embodiment, the doping density is in a range from about $10^{16}/cm^3$ to about $10^{17}/cm^3$. By contrast, in a photo inactive region, the doping density is less than $10^{15}/cm^3$.

An advantageous feature of a doping profile shown in FIG. 3 is that the sharp drop of the doping density helps to reduce the dosage loss in the subsequent thinning process. In addition, the uniform doping density in the majority portion of the photo active region helps to improve photodiode electron transmission characteristics. For example, in accordance with an embodiment, by employing the implantation method described with respect to FIG. 2, the full well capacity of a backside illuminated image sensor can be improved by approximately 14%. Moreover, the white pixel of the backside illuminated image sensor can be improved by approximately 26%.

Figure 4:
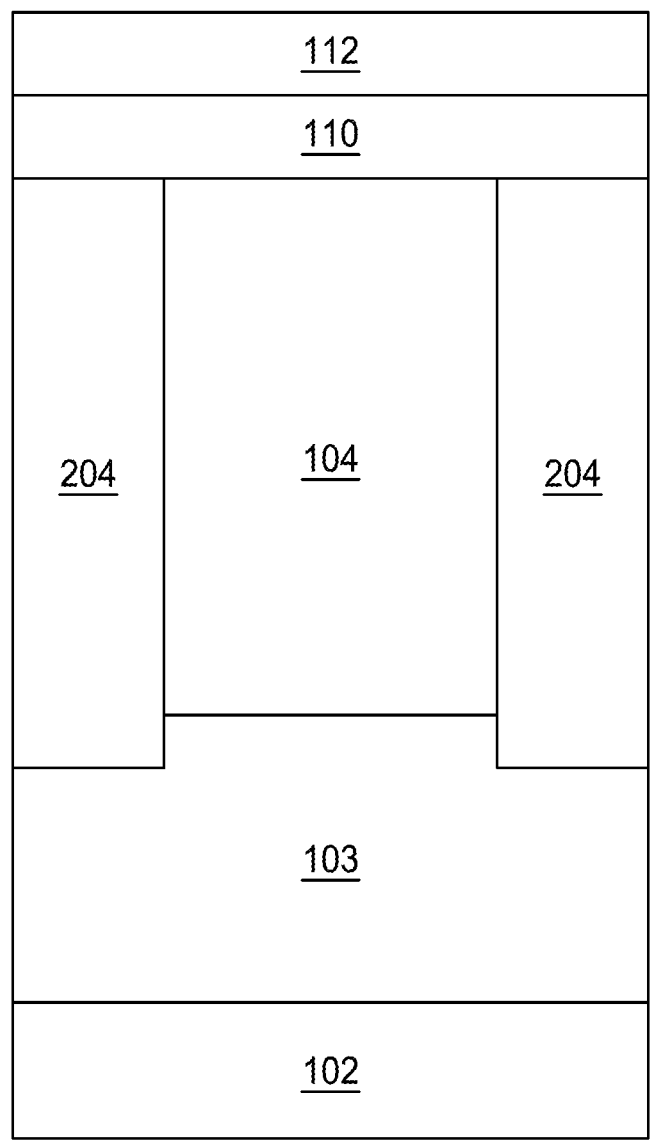
FIG. 4 illustrates a cross sectional view of the semiconductor device shown in FIG. 2 after additional front side layers have been formed over the photo active region in accordance with an embodiment.

FIG. 4 illustrates a cross sectional view of the semiconductor device shown in FIG. 2 after additional front side layers have been formed over the photo active region in accordance with an embodiment. A dielectric layer 110 is typically formed over the photo active region 104. It should be noted that other circuitry (not shown), such as transistors, capacitors, or the like, may also be formed in the epitaxial layer 103. In accordance with an embodiment, the dielectric layer 110 forms a planarized layer upon which other layers (e.g., metal interconnect layers) may be formed. In an embodiment, the dielectric layer 110 may be formed of low-K dielectric materials such as silicon oxide, borophosphosilicate glass (BPSG), phosphosilicate glass (PSG), fluorinated silicate glass (FSG), carbon-doped silicon oxide or the like. The dielectric layer 110 may be formed by any suitable techniques such as chemical vapor deposition (CVD) techniques or the like.

A metal interconnect layer 112 may be formed over the dielectric layer 110. The metal interconnect layer 112 can be patterned by plasma etching or a damascene process and may be formed of any conductive material suitable for a particular application. Materials that may be suitable include, for example, aluminum, copper, doped polysilicon or the like. Contacts and vias (not shown) may be formed to provide electrical connectivity between the metal interconnect layer and underlying circuitry.

Figure 5:
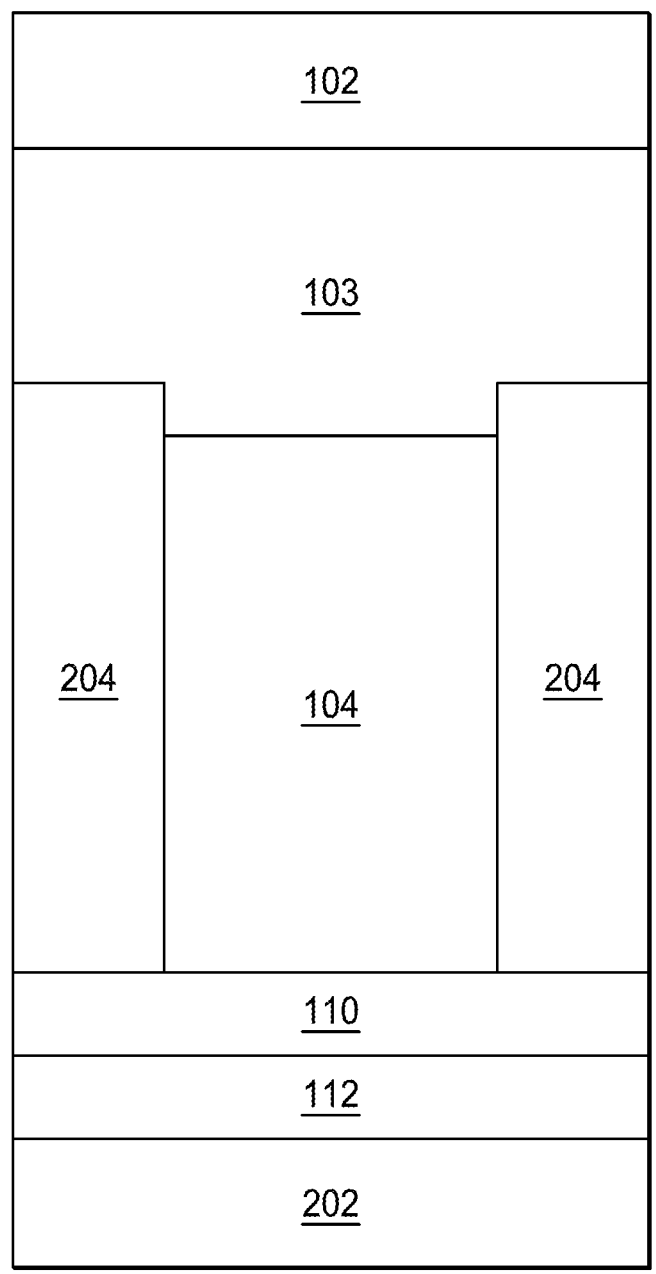
FIG. 5 is a cross sectional view of a backside illuminated image sensor wafer after the wafer is flipped and bonded on a carrier in accordance with an embodiment.

FIG. 5 is a cross sectional view of a backside illuminated image sensor wafer after the wafer is flipped and bonded on a carrier 202 in accordance with an embodiment. Once the metal interconnect layer 112 are formed, the backside illuminated image sensor wafer 200 is flipped and further bounded on a silicon or glass carrier 202. In particular, the front side of the backside illuminated image sensor wafer 200 faces up toward the carrier 202. Various bonding techniques may be employed to achieve bonding between the backside illuminated image sensor wafer 200 and the carrier 202. In accordance with an embodiment, suitable bonding techniques may include adhesive bonding, vacuum bonding, anodic bonding and the like. The carrier 202 may provide sufficient mechanical support to resist forces due to a grinding step of a thinning process. The thinning process will be described below with respect to FIG. 6.

Figure 6:
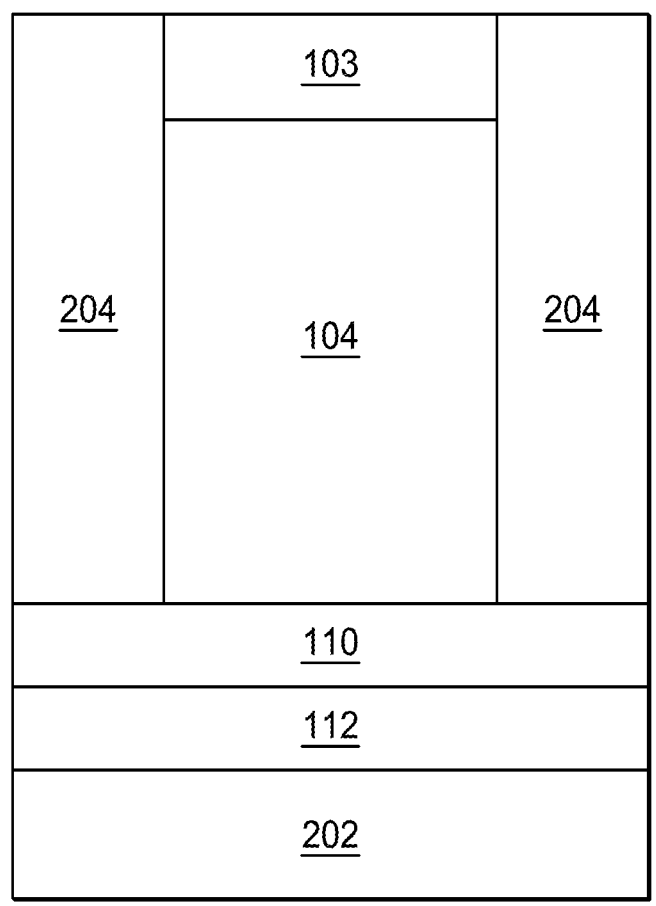
FIG. 6 is a cross sectional view of the backside illuminated image sensor wafer illustrated in FIG. 5 after a thinning process has been applied to the backside of the wafer in accordance with an embodiment.

FIG. 6 is a cross sectional view of the backside illuminated image sensor wafer illustrated in FIG. 5 after a thinning process has been applied to the backside of the wafer in accordance with an embodiment. According to the fabrication processes of backside illuminated image sensors, the substrate is thinned until the p-type substrate 102 (illustrated in FIG. 5) is removed and the p-type epitaxial layer 103 is exposed. More particularly the backside the substrate (e.g., the remaining of the p-type epitaxial layer 103) of the backside illuminated image sensor wafer 100 may be thinned to a thickness in a range from about 2 um to about 2.5 um. Such a thin substrate layer allows light to pass through the substrate (not shown) and hit photodiodes embedded in the substrate without being absorbed by the substrate. The thinning process may be implemented by using suitable techniques such as grinding, polishing and/or chemical etching.

Figure 7:
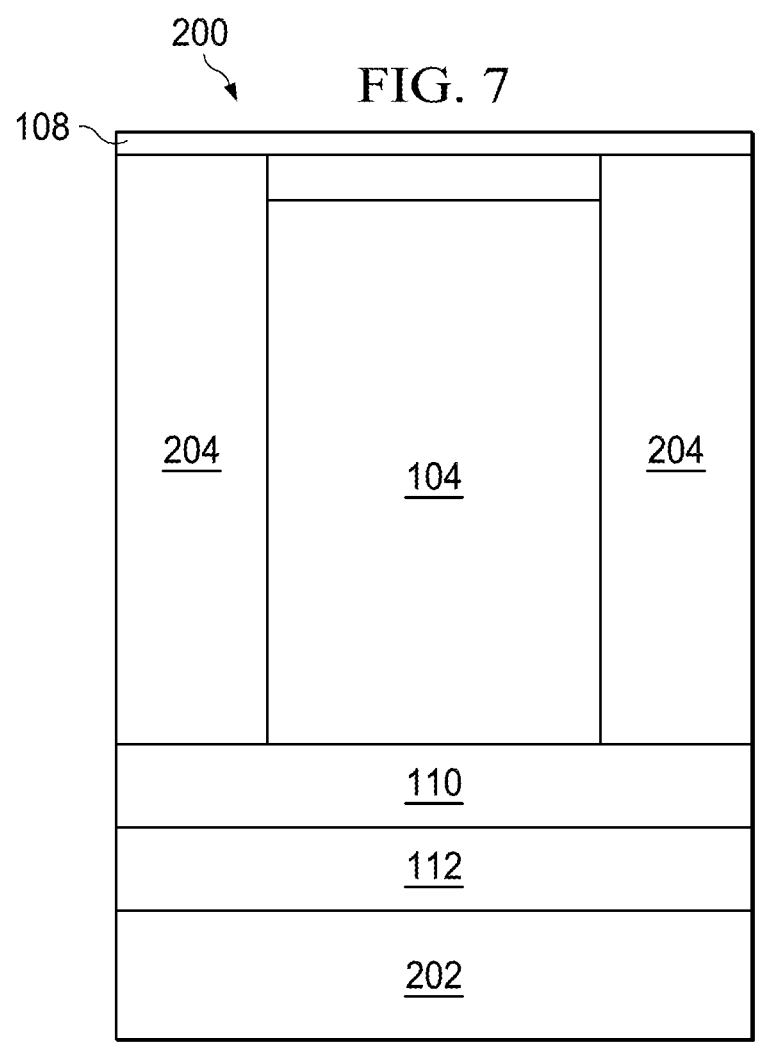
FIG. 7 is a cross sectional view of the backside illuminated image sensor wafer illustrated in FIG. 6 after a thin P+ layer has been applied to the backside of the wafer in accordance with an embodiment.

FIG. 7 is a cross sectional view of the backside illuminated image sensor wafer illustrated in FIG. 6 after a thin P+ layer has been applied to the backside of the wafer in accordance with an embodiment. Furthermore, a thin P+ ion layer 108 may be formed on the backside of the thinned substrate to increase the number of photons converted into electrons. The P+ ion implantation process may cause crystal defects. In order to repair crystal defects and activate the implanted P+ ions, a laser annealing process may be performed on the backside of the backside illuminated image sensor wafer 200.

Figure 8:
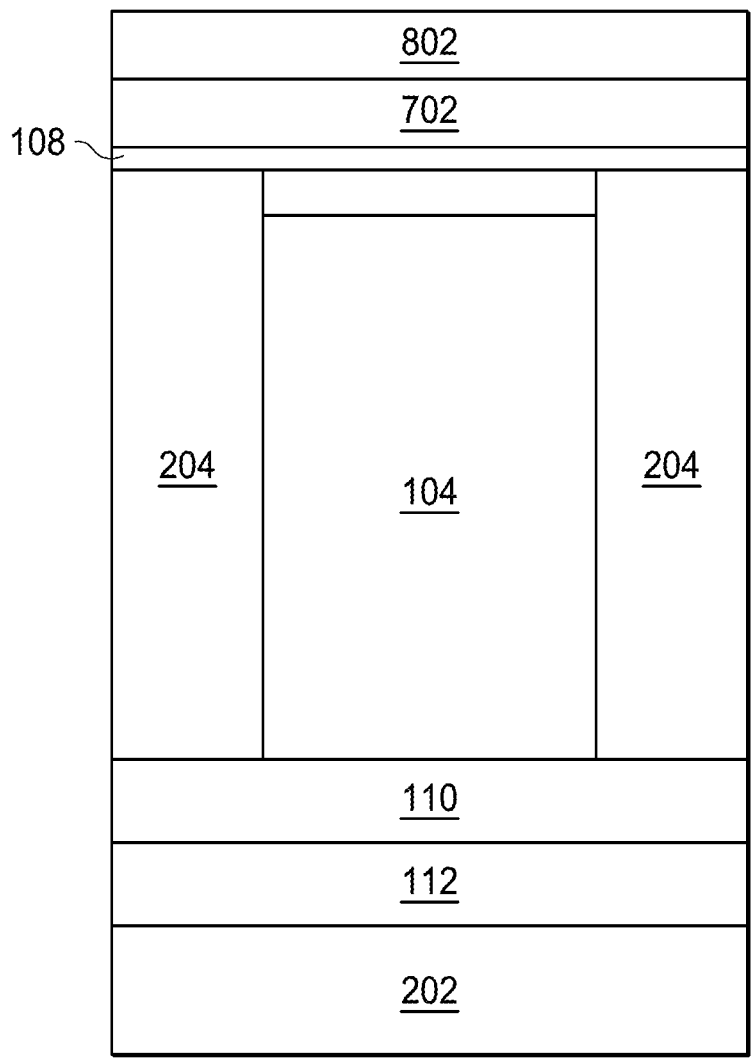
FIG. 8 is a cross sectional view of the backside illuminated image sensor wafer illustrated in FIG. 7 after a color filter layer and a microlens layer have been applied in accordance with an embodiment.

FIG. 8 is a cross sectional view of the backside illuminated image sensor wafer illustrated in FIG. 7 after a color filter layer and a microlens layer have been applied in accordance with an embodiment. The color filter layer 702 may be used to allow specific wavelengths of light to pass while reflecting other wavelengths, thereby allowing the image sensor to determine the color of the light being received by the photo active region 104. The color filter layer 702 may vary, such as a red, green, and blue filter. Other combinations, such as cyan, yellow, and magenta, may also be used. The number of different colors of the color filters 702 may also vary.

In accordance with an embodiment, the color filter layer 702 may comprise a pigmented or dyed material, such as an acrylic. For example, polymethyl-methacrylate (PMMA) or polyglycidylmethacrylate (PGMS) are suitable materials with which a pigment or dye may be added to form the color filter layer 702. Other materials, however, may be used. The color filter layer 702 may be formed by any suitable method known in the art.

The microlens layer 802 may be formed of any material that may be patterned and formed into lenses, such as a high transmittance, acrylic polymer. The microlens layer 802 is about 0.1 um to about 2.5 um in thickness. In accordance with an embodiment, the microlens layer 802 may be formed using a material in a liquid state and spin-on techniques known in the art. This method has been found to produce a substantially planar surface and a microlens layer 802 having a substantially uniform thickness, thereby providing greater uniformity in the microlenses. Other methods, such as deposition techniques like chemical vapor deposition (CVD), physical vapor deposition (PVD), or the like, may also be used.

Figure 9:
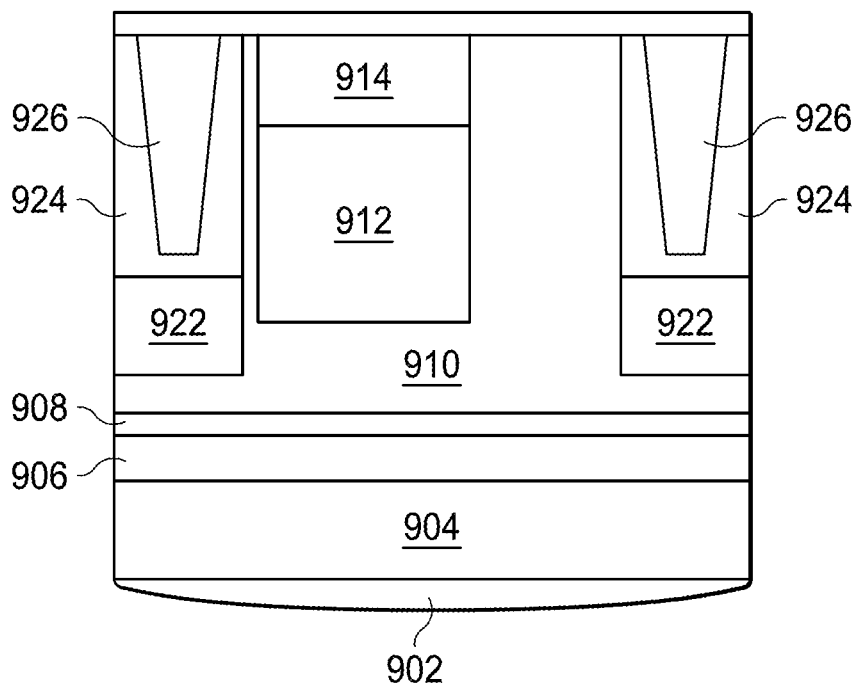
FIG. 9 illustrates a cross sectional view of a backside illuminated image sensor in accordance with another embodiment.

FIG. 9 illustrates a cross sectional view of a backside illuminated image sensor in accordance with another embodiment. In a backside illuminated image sensor, there may be a plurality of pixels, each of which is a photodiode formed in a silicon substrate. In accordance with an embodiment, the substrate 910 may be a p-type epitaxial layer grown from a p-type substrate (not shown). For simplicity, only one pixel is illustrated to show inventive aspects of various embodiments.

As shown in FIG. 9, the pixel 900 includes a photodiode formed by a p-type doped region 914 and an n-type doped region 912. The p-type doped region 914 may be formed by using an ion implantation process from a front side of the wafer. In accordance with an embodiment, the p-type doped region 914 is doped with p-type doping materials such as boron. The doping concentration of the p-type doped region 914 is in a range from about $10^{16}/cm^3$ to about $10^{17}/cm^3$.

In accordance with an embodiment, the n-type doped region 912 may be formed by an ion implantation process performed from the front side of the wafer. N-type doping materials such as phosphorus are doped into the epitaxial layer 910 to form the n-type doped region 912. In accordance with an embodiment, the front side ion implantation process may generate a doping concentration in a range from about $10^{16}/cm^3$ to about $10^{17}/cm^3$.

In order to avoid interference from adjacent pixels, an isolation region may be employed to prevent cross walk between adjacent pixels. The isolation region is formed by a STI structure 926, a cell p-well (CPW) region 924 and a deep p-well (DPW) region 922. The formation of the STI structure has been described above with respect to FIG. 2, and hence is not discussed herein to avoid repetition.

The CPW region 924 is formed of P-type materials such as boron and the like. The CPW region 924 has a doping concentration in a range from about $10^{15}/cm^3$ to about $10^{19}/cm^3$. The CPW region 924 has a doping depth in a range from about 0 um to about 1 um. The DFW region 922 has a doping concentration in a range from about $10^{13}/cm^3$ to about $10^{18}/cm^3$. The DPW region 922 has a doping depth in a range from about 0.5 um to about 2 um. The pixel 900 may include other layers such as P+ layer 908, anti-reflection layer 906, color filter layer 904 and micro lens layer 902, which are well known in the art, and hence is not discussed in further detail herein.

Figure 10:
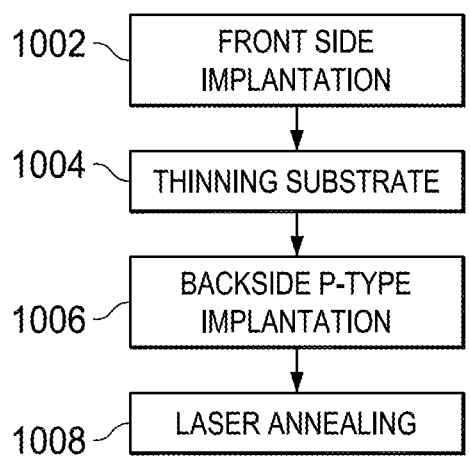
FIG. 10 illustrates a flow chart of a method for forming a backside illuminated image sensor in accordance with an embodiment.

FIG. 10 illustrates a flow chart of a method for forming a backside illuminated image sensor in accordance with an embodiment. At step 1002, a front side implantation process is applied to a CMOS image sensor wafer to form various doped regions such as photo active regions and isolation regions. In accordance with an embodiment, the photo active region may be of a depth of about 2 um.

At step 1004, the CMOS image sensor wafer is flipped and bonded on a carrier. According to the fabrication process of a backside illuminated image sensor wafer, a substrate thinning process is performed on the backside of the substrate so that the thickness of the substrate is reduced to about 2 um in thickness. Such a thinned substrate helps to allow light to propagate from the backside of the substrate.

At step 1006, through an ion implantation process, a thin P+ layer may be formed on the thinned substrate to improve quantum efficiency. In accordance with an embodiment, the thin P+ layer has a thickness in a range from about 100 Å to about 1 um. At step 1008, a laser annealing process is performed on the backside of the substrate to repair defects due to the P+ ion implantation and activate P+ ions.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   implanting ions to form a photo active region over a substrate using a front side ion implantation process, wherein:
   a high energy ion beam having an energy level from about 300 keV to about 1400 keV is employed to perform the front side ion implantation process; and
   the front side ion implantation process has an implantation tilt angle in a range from about one degree to about seven degrees, and wherein a majority portion of a photo active region of the substrate is of a uniform doping density, which is ten times greater than a doping density of a photo inactive region of the substrate.

2. The method of claim 1, further comprising:
   forming an epitaxial layer, wherein the photo active region is embedded in the epitaxial layer;
   forming an isolation region in the epitaxial layer, wherein the isolation region encloses the photo active region;
   forming a dielectric layer over the photo active region; and
   forming a metal interconnect layer over the dielectric layer.

3. The method of claim 2, wherein the epitaxial layer is a p-type layer.

4. The method of claim 1, wherein the photo active region is a photodiode comprising:
   an n-type photodiode region; and
   a p-type photodiode region.

5. The method of claim 1, further comprising:
   forming a P+ layer on a backside of the substrate; and
   applying a laser annealing process to the P+ layer.

6. The method of claim 1, wherein a thickness of the substrate from a front side of the substrate to a backside of the substrate is approximately equal to 2 um.

7. The method of claim 1, further comprising:
   forming a backside illuminated image pixel capable of converting photons into electrons using the photo active region.

8. A method comprising:
   providing a substrate with a first conductivity;
   growing a epitaxial layer on the substrate;
   implanting ions with a second conductivity in the epitaxial layer from a front side of the substrate;
   implanting ions with the first conductivity in the epitaxial layer from the front side of the substrate to form a photo active region adjacent to the front side and a photo inactive region underneath the photo active region, wherein:
   a majority portion of the photo active region is of a uniform doping density, which is ten times greater than a doping density of the photo inactive region; and
   thinning the photo inactive region.

9. The method of claim 8, wherein:
   the first conductivity is p-type; and
   the second conductivity is n-type.

10. The method of claim 8, further comprising:
    forming a P+ layer on the epitaxial layer; and
    applying a laser annealing process to the P+ layer.

11. The method of claim 10, further comprising:
    forming a color filter layer on the P+ layer; and
    forming a mircolens layer on the color filter layer.

12. The method of claim 8, further comprising:
    forming an n-type photodiode region by implanting n-type ions in the epitaxial layer from the front side of the substrate; and
    forming a p-type photodiode region by implanting p-type ions in the epitaxial layer from the front side of the substrate.

13. The method of claim 12, wherein the n-type photodiode region and the p-type photodiode region form a photodiode region embedded in the epitaxial layer.

14. The method of claim 13, further comprising:
    forming an isolation region in the epitaxial layer, wherein the isolation region encloses the photodiode.

15. The method of claim 14, further comprising:
    etching a portion of the epitaxial layer; and
    filling the portion with dielectric materials to form the isolation region.

16. The method of claim 8, further comprising:
    Implanting ions to form the photo active region over the substrate using a front side ion implantation process having an implantation tilt angle in a range from about one degree to about seven degrees.

17. A method comprising:
    providing a wafer comprising a p-type substrate;
    growing a p-type epitaxial layer on the p-type substrate;
    implanting n-type impurity ions into the epitaxial layer to form an n-type photodiode region from a front side of the wafer;
    implanting p-type impurity ions into the epitaxial layer to form a p-type photodiode region from the front side of the wafer, wherein the p-type photodiode region and the n-type photodiode region form a PN junction, wherein:
  a majority portion of the PN junction is of a uniform doping density, which is at least ten times greater than a doping density of the p-type epitaxial layer below the PN junction;

flipping the wafer;

bonding the wafer on a carrier; and thinning the epitaxial layer below the PN junction.

18. The method of claim 17, further comprising:
  forming a dielectric layer over the p-type epitaxial layer; and
  forming a metal layer over the dielectric layer.

19. The method of claim 17, further comprising:
  forming a thin P+ layer over a backside of the wafer;
  applying a laser annealing process on the thin P+ layer;
  forming a color filter layer on the thin P+ layer; and
  forming a microlens layer on the color filter layer.

20. The method of claim 17, further comprising:
  etching a portion of the p-type epitaxial layer; and
  filling dielectric materials in the portion to form an isolation region, wherein the isolation region encloses the PN junction.

\* \* \* \* \*